United States Patent
Iwasaki

(10) Patent No.: US 7,518,449 B2
(45) Date of Patent: Apr. 14, 2009

(54) DOHERTY AMPLIFIER

(75) Inventor: Takashi Iwasaki, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 11/896,179

(22) Filed: Aug. 30, 2007

(65) Prior Publication Data

US 2008/0068078 A1 Mar. 20, 2008

(30) Foreign Application Priority Data

Sep. 20, 2006 (JP) ............................. 2006-253776

(51) Int. Cl.
*H30F 3/68* (2006.01)
(52) U.S. Cl. ................................. 330/124 R
(58) Field of Classification Search ............... 330/124 R
See application file for complete search history.

(56) References Cited

U.S. PATENT DOCUMENTS 5,739,723 A  4/1998 Sigmon et al.
6,917,246 B2 * 7/2005 Thompson .................. 330/295
2006/0049870 A1 3/2006 Hellberg

* cited by examiner

*Primary Examiner*—Robert Pascal
*Assistant Examiner*—Khiem D Nguyen
(74) *Attorney, Agent, or Firm*—Bacon & Thomas, PLLC

(57) ABSTRACT

A Doherty amplifier includes a Doherty amplification circuit and an active bias circuit. The active bias circuit includes an average power detector for detecting a value of a voltage representing an average power of an input signal, an envelop detector for detecting an envelope of the input signal, a threshold calculator for calculating a boundary value of the envelop detected by the envelope detector based on the value of the voltage detected by the average power detector, and a voltage limiter for limiting the envelop detected by the envelope detector below a predetermined value. The bias voltage corresponding to the average power of the input signal is applied to the Doherty amplification circuit.

5 Claims, 7 Drawing Sheets

DOHERTY AMPLIFIER

FIELD OF THE INVENTION

The present invention relates to a Doherty amplifier; and, more particularly, to a Doherty amplifier for controlling biases properly.

BACKGROUND OF THE INVENTION

In general, the amplification of a modulation wave signal with a high peak-to-average power ratio causes a large distortion due to a poor linearity when back-off of an amplifier is made small for improvement of efficiency thereof. On the contrary, when the back-off is made large for improvement of the linearity, the efficiency is lowered. For example, a Doherty amplifier is provided as a method for improving the efficiency with the same back-off.

FIG. 9 shows a configuration of a conventional Doherty amplification circuit. The conventional Doherty amplification circuit includes a distributor 113 for dividing an input signal into two signals; a class AB or B carrier amplifier 111, a class C peak amplifier 112; a mixer 114 for combining an output signal from the carrier amplifier with an output signal from the peak amplifier; a characteristic impedance $R_L$ added to an output end of the carrier amplifier; a transmission line 116 having an electric length of $\theta+90°$; a characteristic impedance $R_L$ added to an output end of the peak amplifier; a transmission line 118 having an electric length of $\Phi$, and transmission lines 115 and 117 added to input ends of the carrier amplifier and the peak amplifier, respectively, to make a combined phase made by the mixer 114 in phase. In addition, a load impedance 103 of $R_L/2$ is connected to an output end of the mixer.

During a low input power in which the peak amplifier 112 is not in operation, an output impedance $Z_d$ at the peak amplifier 112 usually becomes a complex impedance, not an open circuit impedance. Due to this, an output impedance $Z_{d\_p}$ when viewing the peak amplifier from the mixer during the low input power is represented by using $Z_d$, as follows:

$$Z_{d-p} = \frac{Z_d \cos\Phi + jR_L \sin\Phi}{\cos\Phi + j\frac{Z_d}{R_L}\sin\Phi}. \quad \text{Eq. (1)}$$

The relationship between reflection coefficients is expressed by using $\Gamma_d$ and $\Gamma_{d\_p}$ respectively normalized by $R_L$, as follows:

$$\Gamma_{d\_p} = \Gamma_d (\cos 2\Phi - j \sin 2\Phi) \quad \text{Eq. (2).}$$

FIG. 10 depicts a Smith chart representing the relationship between $\Gamma_d$ and $\Gamma_{d\_p}$ in Eq. (2). The reflection coefficient $\Gamma_{d\_p}$ is shifted by an angle of $2\Phi$ in a clockwise direction around $R_L$. By changing the electric length $\Phi$, the output impedance may be viewed as if it is an open circuit impedance.

Meanwhile, if a load impedance of the carrier amplifier is set to $Z_L$(Low) at low input power and to $Z_L$(High) at high input power, instead of representing a load impedance to be $R_L/2$ at the low input power and $R_L$ at the high input power when viewing the mixer from the transmission line 118, $Z_L$(Low) is represented with $Z_L$(High) as follows:

$$Z_{L(Low)} = Z_{L(High)} \cdot \frac{\cos\theta + j2\sin\theta}{2\cos\theta + j\sin\theta}. \quad \text{Eq. (3)}$$

A reflection coefficient r when viewing the load side from the carrier amplifier is represented as follows when normalized by $Z_L$(High):

$$\Gamma = \frac{-1}{3}(\cos 2\theta - j\sin 2\theta) \quad \text{Eq. (4)}$$

FIG. 11 is a Smith chart that represents the relationship between $\theta$ and $\Gamma$ shown in Eq. (4). The reflection coefficient $\Gamma$ is shifted by an angle of $2\theta$ in a clockwise direction around $Z_L$(High).

Under a large back-off condition, the efficiency of the Doherty amplifier improves by using $Z_L$(High) and electric length $\theta$, wherein $Z_L$(High) set to a load impedance $Z_L$(Pmax) that yields a maximum power and the transmission line 116 of $\theta+90°$ matches (transforms) the load impedance $Z_L$(Low) to $Z_L(\eta max)$ performing maximum efficiency at low input power.

In this regard, an experimental result is reported on a Doherty power amplifier that employs an adaptive bias circuit applying an optimum gate bias according to the envelope of an input modulation wave signal (see, e.g., J. Cha, Y. Yang, B. Shin and B. Kim, "An Adaptive Bias Controlled Power Amplifier with a Load Modulated Combining Scheme for High Efficiency and Linearity", 2003 IEEE MTT-S Digest, TU3B-4).

FIG. 3 is a graph showing one characteristic example of a gate bias voltage $V_g$ which is supposed to be realized by the adaptive bias circuit. In the graph, the horizontal axis (algebra axis) represents an input power (instantaneous value) and the vertical axis indicates a gate bias voltage $V_g$.

In FIG. 3, a gate bias voltage A represents a gate bias voltage of a carrier amplifier; a gate bias voltage B indicates an optimum gate bias voltage of a peak amplifier when an adaptive bias is not applied thereto; an input power D denotes an input power yielding an average output power of a Doherty amplifier; and an input power E indicates a maximum input power by a peak-to-average power ratio of signal. Further, a region of oblique portion F represents the relationship between a gate bias voltage when the peak amplifier is not in operation and an input power.

The gate bias voltage shown in FIG. 3 is generated by detecting the envelope of an input signal and performing a linear operation of the detected envelope using an OP amp (operational amplifier), and is the function of an envelope power at that moment. It may be considered that the fundamental purpose of the peak amplifier is to adjust the input power D at which the peak amplifier starts to turn-on to the vicinity of the average power and then to amplify a peak exceeding an average power. However, the ratio of input powers D and E depends upon the configuration of the amplifier, which makes it almost impossible to change the ratio using the conventional Doherty amplifier starting at around 3 dB. (see, e.g., Japanese Patent No. 3372438).

Meanwhile, for example, in mobile communications that employs a multicarrier signal including a plurality of carrier waves, a peak-to-average power ratio is varied by the number of carrier waves. Further, an output power of a transmission amplifier for amplifying these signals is not also constant due to a transmission power control and so on. Accordingly, in case a linear amplification with high efficiency is performed in a wide dynamic range, it is required to apply an optimum bias dependent on a varying peak-to-average power ratio or an input power.

FIG. 12 shows a graph representing an adjacent channel leakage power ratio (ACLR) in a case where the gate bias of the peak amplifier is constant and in case of using the adaptive bias circuit as mentioned above in the conventional Doherty amplifier.

If a Doherty amplifier provided with the adaptor bias circuit is used in a certain power below an average input power, the gate bias of the peak amplifier is always set below the optimum gate bias B, thereby making it impossible to fully operate the peak amplifier when a signal having a high peak-to-average power ratio is inputted thereto. Therefore, the load modulation cannot be obtained, and thus, the load impedance at the carrier amplifier when the peak power is inputted thereto becomes almost $Z_L(Low)$ ($Z_L(\eta\ max)$), which degrades a value of the ACLR at the time of a peak power exceeding an average output power G.

In addition, in the case of a signal having low peak-to-average power ratio, it is not possible to fully operate the peak amplifier. Therefore, a value of the ACLR is degraded at a certain power below the average output power.

As described above, in a Doherty amplifier, there is a need for improvement to apply an optimum bias dependent on a varying input power and/or a peak-to-average power ratio.

SUMMARY OF THE INVENTION

The present invention has been made in view of the above problems of the prior art, and, therefore, it is an object of the present invention to provide a Doherty amplifier capable of applying an optimum bias dependent on a varying input power and/or a peak-to-average power ratio.

In accordance with an embodiment of the present invention, there is provided a Doherty amplifier, which includes:

a Doherty amplification circuit including a distributor for dividing an input signal, a class AB or B carrier amplifier for amplifying one of the signals divided by the distributor, a class C peak amplifier for amplifying the other of the signals divided by the distributing means, and a combiner for combining an output signal from the carrier amplifier with an output signal from the peak amplifier; and an active bias circuit including an average power detector for detecting a voltage value representing an average power of the input signal, an envelope detector for detecting an envelope of the input signal, a threshold calculator for calculating a boundary value of the envelope detected by the envelope detector based on the voltage value detected by the average power detector, and a voltage limiter for limiting the envelope detected by the envelope detector below a predetermined value, wherein a bias voltage corresponding to the average power of the input signal is applied to the Doherty amplification circuit.

Further, in the Doherty amplifier, the active bias circuit may further includes:

a peak hold circuit for holding a maximum voltage value of the envelope detected by the envelope detector;

a difference calculator for calculating a difference between the maximum voltage value of the envelope held by the peak hold circuit and the voltage value detected by the average power detector; and a voltage controlled amplifier for amplifying the envelope detected by the envelope detector by changing an amplification rate using the voltage value calculated from the difference calculator as a control voltage, wherein a bias voltage corresponding to the peak-to-average power ratio of the input signal is applied to the Doherty amplification circuit.

As set forth above, even in case an input power and/or a peak-to-average power ratio of signal to be amplified is varied, the present invention can apply an optimum bias corresponding to the varying input power and/or peak-to-average power ratio.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings.

Figure 1:
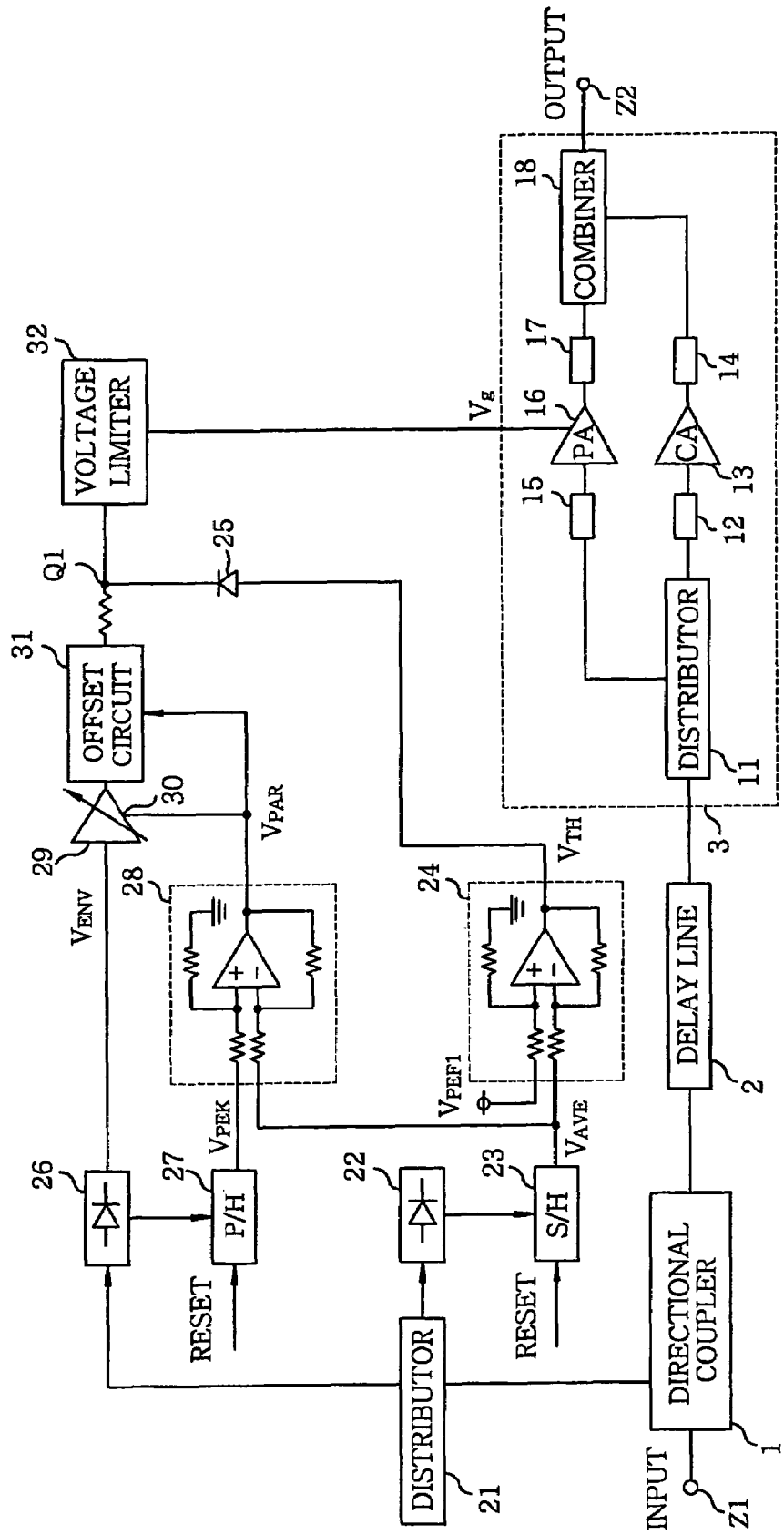
FIG. 1 shows an exemplary configuration of a Doherty amplifier in accordance with an embodiment of the present invention.

Referring to FIG. 1, there is shown an exemplary configuration of a Doherty amplifier having an active bias circuit in accordance with an embodiment of the present invention.

The Doherty amplifier of this embodiment includes a directional coupler 1, a delay line 2, and a Doherty amplification circuit (a part of main body of the Doherty amplifier) 3, which are arranged between an input terminal Z1 and an output terminal Z2. The Doherty amplification circuit 3 is provided with a distributor 11, a transmission line 12 for delay, a carrier amplifier (CA) 13, a transmission line 14 having an electric length of $\theta+90°$, a transmission line 15 for delay, a peak amplifier (PA) 16, a transmission line 17 having an electric length of $\Phi$, and a combiner 18.

In addition, the Doherty amplifier of this embodiment includes a distributor 21, an average power detector 22, a sample hold circuit (S/H) 23, an operational amplifier 24, a diode 25, an envelope detector 26, a peak hold circuit (P/H) 27, an operational amplifier 28, a voltage controlled amplifier 29 having a voltage controlled terminal 30, an offset circuit 31, and a voltage limiter 32.

An example of operation carried out by the Doherty amplifier of this embodiment will be described below. This example illustrates a case where the Doherty amplifier is installed at a transmission part of a base station device of a wireless communication system employing a W-CDMA (Wideband-Code Division Multiple Access) system and so on.

First, a signal (in this example, a modulation wave signal) to be sent is inputted to the input terminal Z1. The signal from the input terminal Z1 is delayed by the delay line 2 after passing through the directional coupler 1, and applied to the Doherty amplification circuit 3 in which the signal is amplified and then is outputted at the output terminal Z2.

Here, when the signal from the input terminal Z1 is provided by the directional coupler 1 to the delay line 2, it is also provided to the distributor 21. The directional coupler 1 may be replaced by any components having a capability of splitting the input signal into two or more branches.

The configuration of the Doherty amplification circuit 3 is basically the same as that of the prior art.

That is, the distributor 11 divides the signal (in this example, the modulation wave signal) provided from the delay line 2 into two signals in this embodiment, and outputs one of the two divided signals to the carrier amplifier 13 via the transmission line 12 and the other to the peak amplifier 16 via the transmission line 15.

The class AB or B carrier amplifier 13 amplifies the one of the two divided signals inputted thereto and outputs thus amplified signal to the combiner 18 via the transmission line 14.

The class C peak amplifier 16 amplifies the other of the two divided signals applied thereto and provides thus amplified signal to the combiner 18 via the transmission line 17.

The combiner 18 combines an output signal from the carrier amplifier 13 with an output signal from the peak amplifier 16 to output the combined signal to the output terminal Z2.

Further, the transmission line 14 added to an output end of the carrier amplifier 13 is installed to optimize a load impedance of the carrier amplifier 13 at the time when the low input power is applied and the peak amplifier 16 is not in operation.

Also, the transmission line 17 added to an output end of the peak amplifier 16 is installed to open impedance when viewing the peak amplifier 16 from the combiner 18 at the time the low input power is applied and the peak amplifier 16 is not operated.

The distributor 21 receives the signal provided by the directional coupler 1 and divides it into two signals. In the distributor 21, one of the two divided signals is provided to the average power detector 22 and the other of the two divided signals is provided to the envelope detector 26.

The average power detector 22 converts the one of the two divided signals provided thereto into a voltage representing an average power (or average amplitude) thereof and provides the voltage to the sample hold circuit 23.

The sample hold circuit 23 samples and holds a value of the voltage provided from the average power detector 22, for example, based on an appropriate sample timing, and then outputs the held value of the voltage to the two operational amplifiers 24 and 28 as a voltage $V_{AVE}$. The average power detector 22 and the sample hold circuit 23 may be replaced by any circuits having a capability of acquiring the average power.

The envelope detector 26 converts the other of the two divided signals provided thereto into a voltage $V_{ENV}$ representing an envelope power (or an amplitude) thereof, and outputs the voltage $V_{ENV}$ to the peak hold circuit 27 and the voltage controlled amplifier 29.

The peak hold circuit 27 detects and holds a peak (a maximum value) of the voltage $V_{ENV}$ provided from the envelope detector 26, and provides the held peak to the operational amplifier 28 as a voltage $V_{PEK}$. The voltage held in the peak hold circuit 27 is reset when a reset signal is provided thereto. Further, the sample timing of the sample hold circuit 23 as set forth above is synchronized with the reset signal.

The operational amplifier 28 performs a differential amplification (or an attenuation) on a value of the voltage from the sample hold circuit 23 and a value of the voltage from the peak hold circuit 27, and outputs the result to the voltage controlled terminal 30 of the voltage controlled amplifier 29 and an offset terminal of the offset circuit 31 each as a voltage $V_{PAR}$ representing a peak-to-average power ratio of signal.

The voltage controlled amplifier 29 amplifies the envelope voltage $V_{ENV}$ obtained by the envelope detector 26 at an amplification rate a which is controlled by a value of the voltage $V_{PAR}$ from the operational amplifier 28, and outputs thus amplified signal to the voltage limiter 32. A variable amplification rate makes it possible to generate an ideal delicate curve of the gate bias voltage, which is difficult to achieve by the conventional linear amplification.

The offset circuit 31 amplifies the voltage $V_{ENV}$ from the voltage controlled amplifier 29 in an amplification rate $\beta/\alpha$ ($\beta$ and $\alpha$ are an integer), adds the amplified voltage to an offset voltage $YV_{PAR}$ based on the value of the voltage $V_{PAR}$ from the operational amplifier 28, and outputs a voltage $\beta V_{ENV} + YV_{PAR}$ via a resistor. Here, Y denotes a proportional integer, which may be either a positive integer or a negative integer. Further, the offset voltage may also be obtained through a value based on $V_{AVE}$, instead of being based on $V_{PAR}$.

The operational amplifier 24 amplifies (or attenuates) the voltage value $V_{AVE}$ provided from the sample hold circuit 23, and outputs the result through the diode 25 as a threshold voltage $V_{TH}$.

Figure 3:
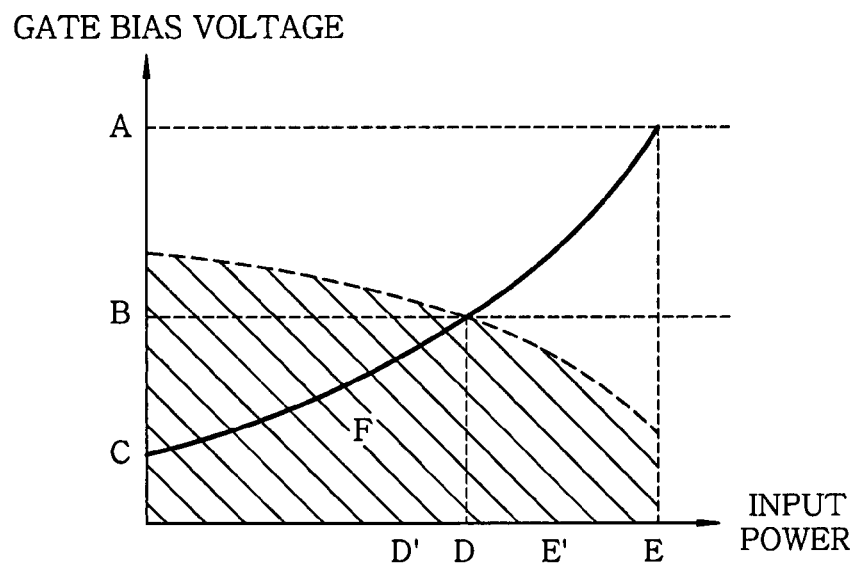
FIG. 3 offers a characteristic example of a gate bias voltage in an adaptive bias circuit.

$V_{TH}$ (precisely, $V_{TH}-V_F$) corresponds to the dashed line for defining the hatched area in FIG. 3. In other words, it indicates a gate bias voltage at a boundary line (where a conduction angle of a transistor becomes exactly zero) on which the peak amplifier may or may not operate in accordance with the input power at that moment. It should be noted that $V_{TH}$ decreases as the input power increases.

An output from the offset circuit 31 and an output from the diode 25 are at a connection point Q1, and a combined signal of these outputs is inputted to the voltage limiter 32. If a forward voltage $V_F$ of the diode 25 is neglected as being sufficiently small, one of the voltage $\beta V_{ENV} + YV_{PAR}$ and the voltage $V_{TH}$, which has the higher voltage, is inputted to the voltage limiter 32. Substantially, the threshold voltage $V_{TH}$ becomes the lowest limit.

The voltage limiter 32 limits the voltage inputted thereto below a certain voltage in order to prevent the destruction of the peak amplifier due to an excessive bias voltage, and applies a limited voltage as a gate bias voltage $V_g$ of the peak amplifier 16 of the Doherty amplification circuit 3.

Figure 4:
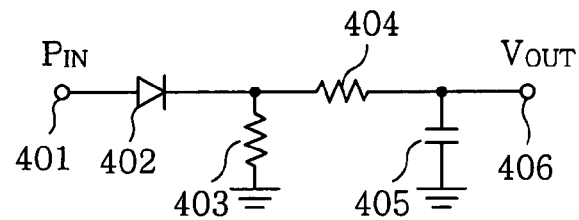
FIG. 4 illustrates an inner configuration of an average power amplifier 22.
Figure 5:
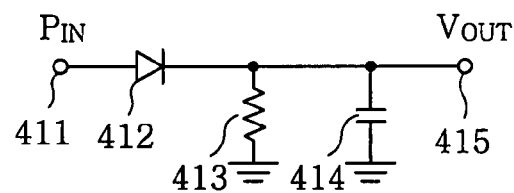
FIG. 5 depicts an inner configuration of an envelope detector 26.

FIG. 4 is a diagram showing an inner configuration of the average power amplifier 22 and FIG. 5 is a diagram showing an inner configuration of the envelope detector 26. FIGS. 4 and 5 are examples of those having very simple configurations, which are differed by a difference of whether the detected outputs are averaged or not.

Each of input terminals 401 and 411 is connected with the distributor 21. Each of diodes 402 and 412 converts the frequency of the modulated component included in the input signal provided thereto into a baseband by its nonlinearity. Accordingly, a signal close to the envelope of the modulated carrier is generated at each of input terminals 401 and 411.

Each of resistors 403 and 413 derives their signal from current flowing in each of the diodes 402 and 412.

A capacitor 414 smoothes the derived signal in order to maintain the envelope shape including a peak, thereby generating an envelope signal.

Meanwhile, a resistor 404 and a capacitor 405 serve as an average circuit for calculating an average of voltages generated in the resistor 403. A time constant of the average voltage is greater than that of the envelope detector 26. As a consequence, the peak may not be outputted while maintaining it's magnitude.

Lastly, each of output terminals 406 and 415 outputs an average power signal $V_{AVE}$ and an envelope signal $V_{ENV}$, respectively.

As described above, when the nonlinearity of the diode or the peripheral circuit is appropriately selected, the signal outputted from the diode can be applied to either the envelope detection or the square detection (power detection).

Further, the average power detector 22 or the envelope detector 26 may not output a completely precise value. In other words, it is preferable to obtain two signals having different sensitivities to the peak and a signal approximating to PAR. Moreover, it is preferable that the average power signal outputted from the average power detector 22 be able to reproduce, with high accuracy, the dashed line for defining the boundary of the hatched area F in FIG. 3.

Figure 6:
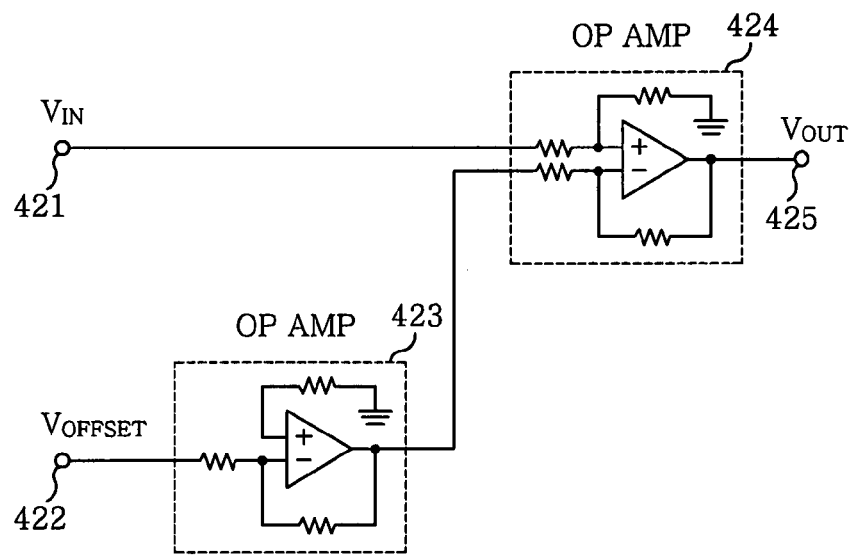
FIG. 6 shows an inner configuration of an offset circuit 31.

FIG. 6 is a diagram showing an inner configuration of the offset circuit 31.

Figure 2:
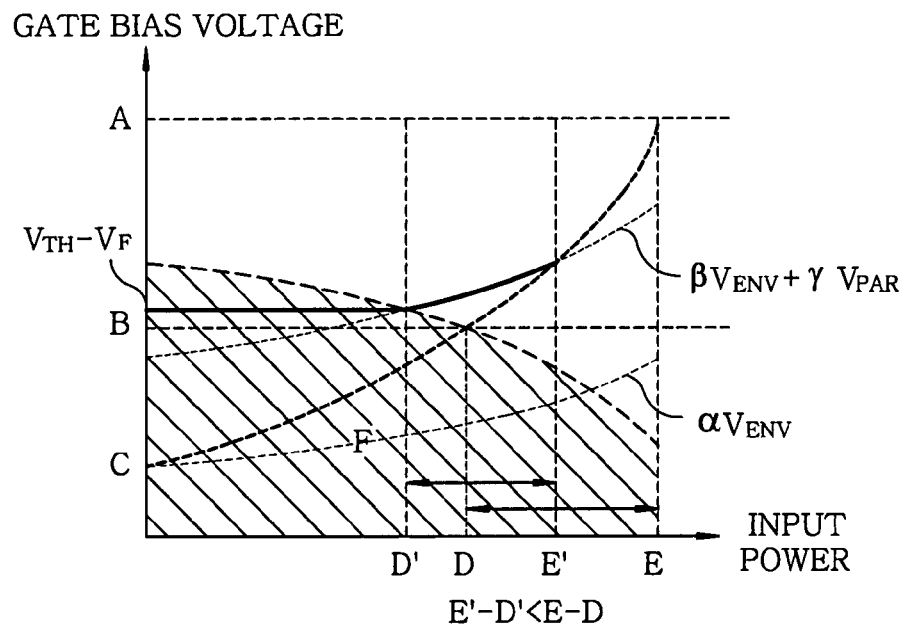
FIG. 2 shows a characteristic example of a gate bias voltage in an active bias circuit in accordance with the present invention.

Here, referring to FIG. 2, there is provided a dynamic characteristic example of a bias voltage $V_g$ in the active bias circuit of the Doherty amplifier of the embodiment. In FIG. 2, in the same manner as FIG. 3, the horizontal axis of the graph represents an input power and the vertical axis thereof indicates a gate bias voltage.

In FIG. 2, a gate bias voltage A represents a gate bias voltage of the carrier amplifier 13, a gate bias voltage B denotes a gate bias voltage of the peak amplifier 16 being optimized when an active bias is not applied thereto, an input power E indicates an input power yielding a Maximum output power inherent in the Doherty amplifier, and an input power D designates an input power at which the peak amplifier starts to turn-on. In order to realize the load modulation, an optimal ratio of the power D and the power E is determined as an inherent value of the Doherty amplifier (e.g., in a range from about 3 dB and about 6 dB in the case of a 2-stage Doherty amplifier). The ratio thus determined is insufficient compared to a PAR (peak to average power ratio) of a preset signal. A thick dashed line indicates a curve of a bias voltage that becomes optimal when the signal of the PAR corresponding to the ratio is provided. Since it is the same as the curve shown in FIG. 3, it is referred to as a conventional curve. That is, the peak amplifier just starts to turn-on when the input power exceeds the average power D and, thus, the input power reaches the maximum power E. At this time, there is applied a bias voltage of class A at which a maximum gain and a maximum output can be obtained. Between the powers D and E, the conventional curve is plotted, e.g., such that the static linearity of the Doherty amplifier is more optimal. This curve is obtained on the assumption that the maximum output power is attained at the power E. When the input power is lower than the power level E, it is not necessarily optimal.

When a signal having a power D' and a power E', which are lower than the input power D and the input power E, respectively, is inputted, the bias voltage $V_g$ is represented as indicated by a thick solid line. That is, although an input power is less than the power D', the $V_g$ is maintained at the boundary of an oblique portion F at the time of the power D'. And, when the input power exceeds the power D', pursuant to $\beta V_{ENV} + \gamma V_{PAR}$ (or $\beta V_{ENV} + \gamma V_{AVE}$), the $V_g$ slowly rises, and at the power E', reaches the voltage $V_g$ suitable for the power E'. β, γ or the like is selected from such a value where the conventional curve can be realized. Referring to FIG. 2, the slope of the curve increases as the power E' or D' increases. The slope (i.e., the amplification ratio α of the voltage controlled amplifier 29) is approximate to a value obtained by dividing the 0~2 square of the peak power by the 0~1 square of average power. For example, if $V_{PEK}$ or $V_{AVE}$ in FIG. 1 is algebraically transformed, a constant of the operational amplifier 28 is determined so that a gain to $V_{PEK}$ becomes greater than that to $V_{AVE}$. Even if $V_{PEK}$ or $V_{AVE}$ is linear, it is possible to achieve the same characteristics by the operational amplification. That is, $V_{PAR}$ or α does not necessarily indicate an intrinsic PAR. In fact, FIG. 2 shows that a increases as $V_{PEK}$ increases even if the PAR is the same. However, a constantly has a positive relationship with the PAR.

Thus, in this example, the operation starting point of the peak amplifier 16 is always consistent with an average power so that a bias voltage greater than a conventional bias voltage can be applied below the power E. Accordingly, it is possible to improve the degradation of ACLR because of an easy turn-on of the peak amplifier even at a low output power or at a high PAR (Power to Average power Ratio). This is considered because the gain inefficiency to the unexpected peak that is unlikely to be kept up with the bias voltage has been improved or because the slight load modulation between the power D and the power E has enabled the gain inefficiency of the carrier amplification to be compensated and the linearity to be improved. Further, although the power E' is hardly ever exceeded, the bias voltage $V_g$ continues to rise even if it is exceeded.

Figure 7:
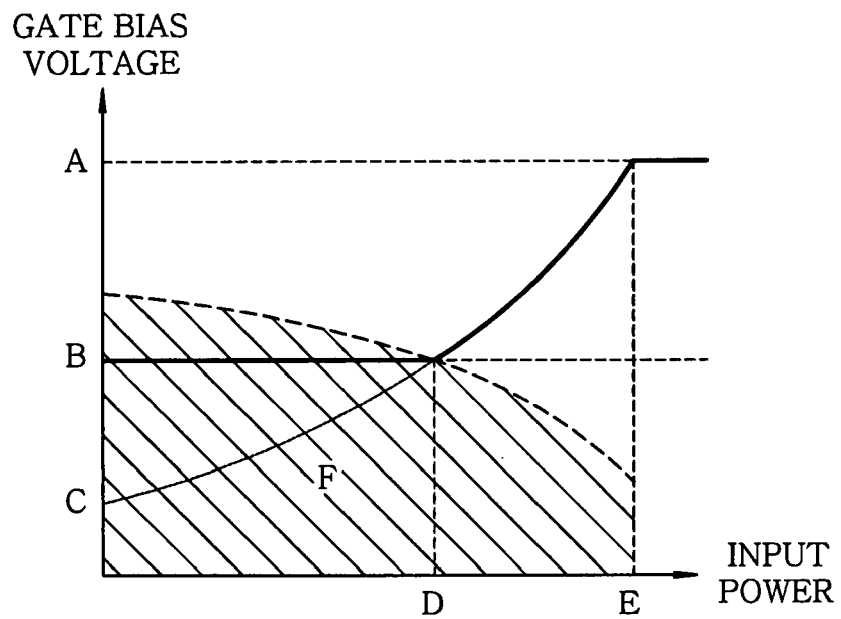
FIG. 7 illustrates another characteristic example of the gate bias voltage in the active bias circuit.

FIG. 7 is a diagram showing another characteristic example of a gate bias voltage in the active bias circuit, and represents a case where the power D' and the power E' in FIG. 2 are equivalent to the existing power D and power E, respectively. In this case, when an input power is less than the power D, a bias suitable for the power D corresponding to the average output power is continuously applied. Although it is rare, when the power D' exceeds the power D, it is preferable to maintain the curve of FIG. 7 regardless of the power E'.

Figure 8:
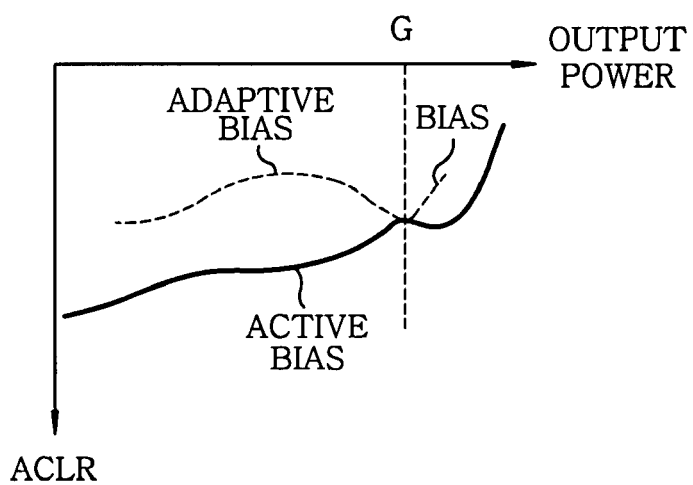
FIG. 8 presents another characteristic example of the gate bias voltage in the active bias circuit.
Figure 9:
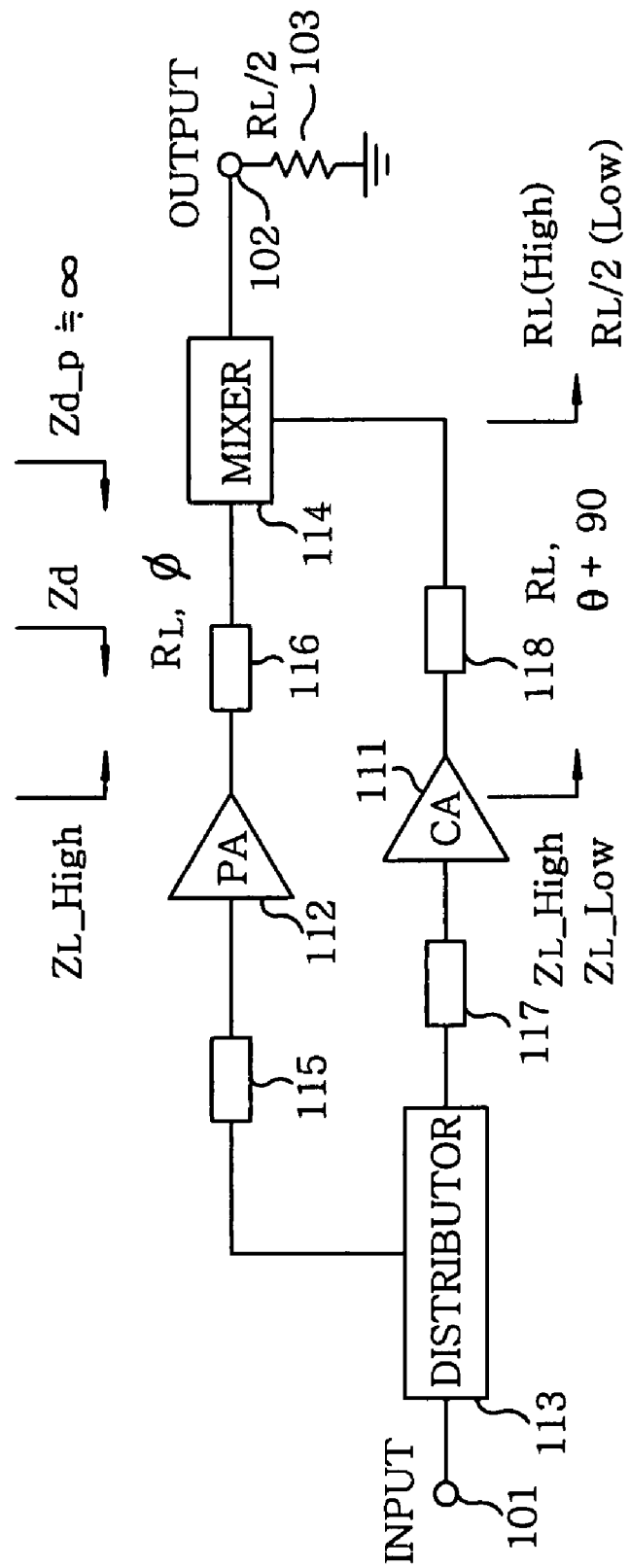
FIG. 9 shows a configuration of a conventional Doherty amplification circuit.
Figure 10:
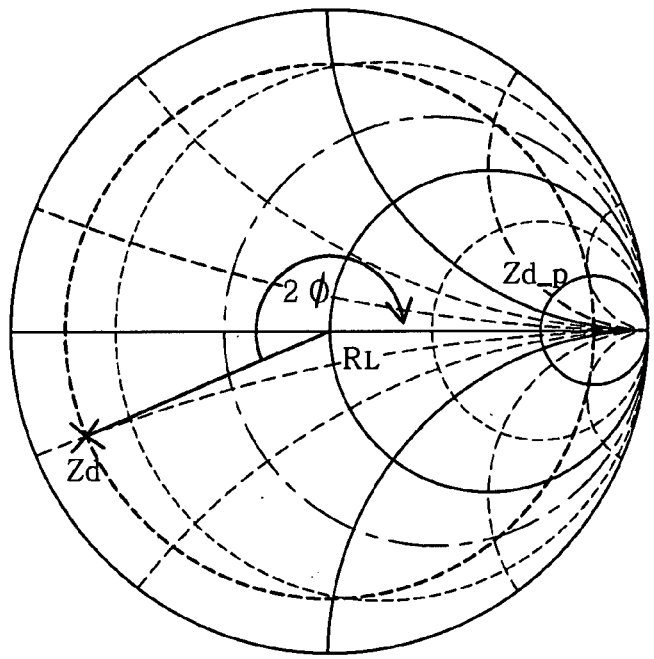
FIG. 10 depicts a Smith chart representing the relationship between an output impedance $\Gamma_d$ when observing the peak amplifier and a value $\Gamma_{d\_p}$ at peak.
Figure 11:
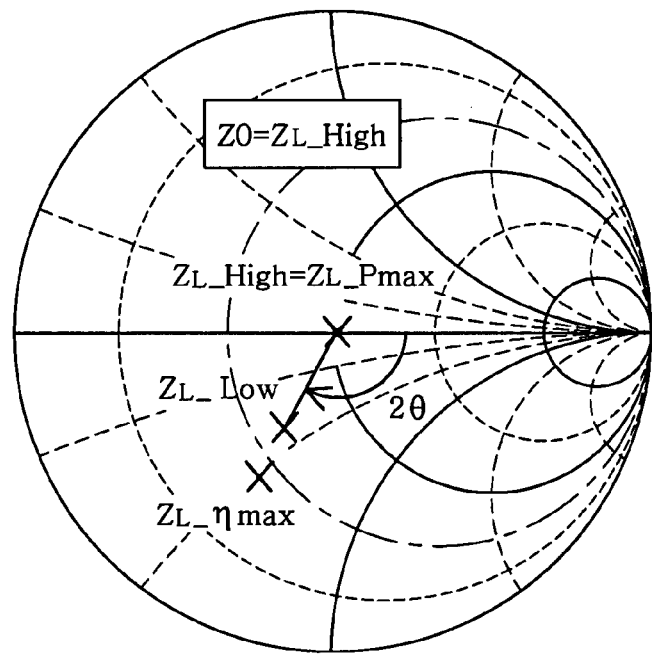
FIG. 11 provides a Smith chart representing the relationship between an electric length $\theta$ of a transmission line 116 and a reflection coefficient $\Gamma$ when viewing a load side from the carrier amplifier.
Figure 12:
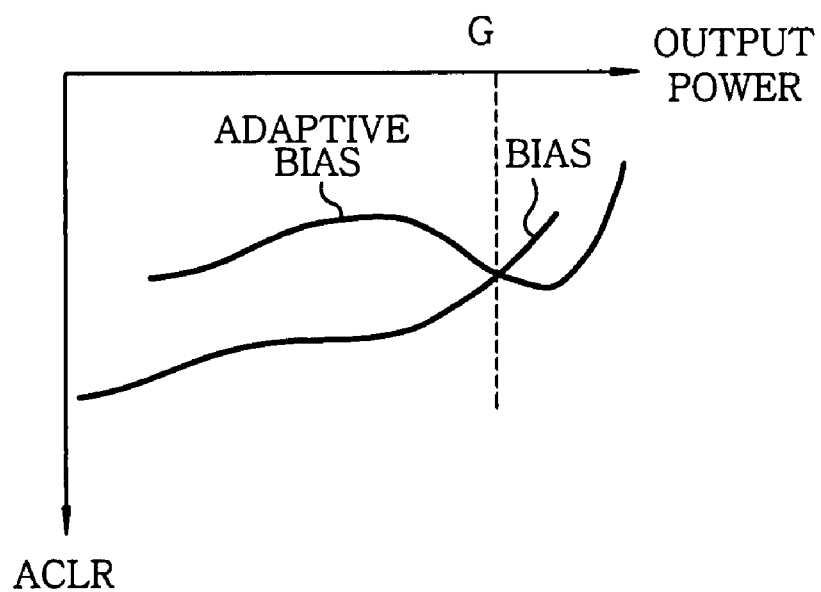
FIG. 12 shows graphs of ACLR of the conventional Doherty amplifier using a fixed bias and an adaptive bias.

FIG. 8 depicts a graph of ACLR in case of using the active bias circuit of this embodiment. Even for the input signal having the power D' and the power E' as shown in FIG. 2, the gate bias of the peak amplifier is also solved from being insufficient, thereby maintaining ALCR to be equivalent to the conventional Doherty amplifier in a region below an output power G corresponding to the low average power.

As set forth above, according to the Doherty amplifier of this embodiment, it is possible to efficiently perform a linear amplification in the wide dynamic range by properly setting the circuit mentioned above depending on an average power of signal to be amplified, a peak-to-average power ratio and an input power.

As a concrete example, a slope of bias being increased is controlled according to a peak-to-average power ratio by setting a minimum value of bias depending on an average power in the active device which increases the gate bias of the peak amplifier 16 according to signal level.

Further, the Doherty amplifier 16 of this embodiment can be driven by a bias that is dependent on a peak-to-average power ratio of a modulation wave signal through the use of the active bias circuit, wherein the active bias circuit includes the peak hold circuit 27 for holding the maximum voltage value of the envelope, an operational circuit (in this embodiment, the operational amplifier 28) for calculating a difference between the average power voltage value and the maximum envelope voltage value, and the voltage controlled amplifier 29 for making a change of an amplification rate of the envelope by using the voltage obtained by the operational circuit as a control voltage. Additionally, the Doherty amplifier of this embodiment offsets the bias by making a feedback of the control voltage to the average power detector 22 and the envelope detector 26.

Also, although this embodiment has illustrated the case of driving the peak amplifier 16 with the bias, it is also possible to drive the carrier amplifier 13 with the adaptor bias circuit having the same configuration wherein only the integers such as α and γ are different.

Here, the configuration of the system or device of the present invention is not limited to that set forth above, but various configurations may be employed. For example, the calculation of the peak-to-average power ratio is not limited to the use of the peak hold circuit or the sample hold circuit, but may be done by a difference which is obtained by using different types of two detection circuits (power and amplitude detection circuits) and so on which are subjected to the influence of crest factor. The detection circuit may also perform logarithmic detection.

While the present invention has been described with respect to the embodiments, it will be apparent to those skilled in the art that various changes and modifications may be made without departing from the scope of the invention as defined in the following claims.

What is claimed is:

1. A Doherty amplifier, comprising:
a Doherty amplification circuit including a distributor for dividing an input signal, a class AB or B carrier amplifier for amplifying one of the signals divided by the distributor, a peak amplifier for amplifying the other of the signals divided by the distributing means, and a combiner for combining an output signal from the carrier amplifier with an output signal from the peak amplifier; and
an active bias circuit including an average power detector for detecting a voltage value representing an average power of the input signal, an envelope detector for detecting an envelope of the input signal, a threshold calculator for calculating a lower-side limiting value of the envelope detected by the envelope detector based on the voltage value detected by the average power detector, and a voltage limiter for limiting the envelope detected by the envelope detector below a predetermined value,
wherein a bias voltage corresponding to the average power of the input signal is applied to the Doherty amplification circuit.

2. The Doherty amplifier of claim 1, wherein the active bias circuit further includes:
a peak hold circuit for holding a maximum voltage value of the envelope detected by the envelop detector;
a difference calculator for calculating a difference between the maximum voltage value of the envelope held by the peak hold circuit and the voltage value detected by the average power detector; and
a voltage controlled amplifier for amplifying the envelop detected by the envelope detector by changing an amplification rate using the voltage value calculated from the difference calculator as a control voltage,
wherein a bias voltage corresponding to the peak-to-average power ratio of the input signal is applied to the Doherty amplification circuit.

3. An amplifying method of a Doherty amplifier which combines an output signal from a first amplifier with an output signal from a second amplifier, the method comprising:
the $1^{st}$ step of detecting an envelope signal of a signal inputted to the Doherty amplifier;
the $2^{nd}$ step of detecting a magnitude of the signal inputted to the Doherty amplifier with high sensitivity to a peak;
the $3^{rd}$ step of detecting a magnitude of the signal inputted to the Doherty amplifier with low sensitivity to the peak;
the $4^{th}$ step of calculating a value of peak/average power ratio (PAR) based on the detection results of the $2^{nd}$ and the $3^{rd}$ step;
the $5^{th}$ step of offsetting the envelope signal according to the value of the PAR; and
the $6^{th}$ step of operating a lowest limiting value of the offset envelope signal based on a detection of the $3^{rd}$ step and applying a gate bias to the second amplifier based on the envelope signal restricted to the lowest limiting value.

4. The amplifying method of claim 3, further comprising:
the $7^{th}$ step of amplifying the envelope signal with gain which increase in accordance with the raise of the RAR.

5. A Doherty amplifier comprising:
a distributor for dividing an input signal;
a class AB or B carrier amplifier for amplifying one of the signals divided by the distributor;
a peak amplifier for amplifying the other of the signals divided by the distributor;
a combiner for combining an output signal from the carrier amplifier with an output signal from the peak amplifier; and
an active bias control circuit for controlling a gate bias voltage of the peak amplifier to be a first value at which the peak amplifier starts to turn-on when an instantaneous input power is a preset average input power; for controlling the gate bias voltage to be equal to a second value of a curve for allowing optimal static characteristics when the instantaneous input power is a preset maximum input power; and for controlling the gate bias voltage to be maintained at the first value when the instantaneous input power is lower than a preset average input power.

* * * * *